US012622267B2

(12) United States Patent
Ronning

(10) Patent No.: US 12,622,267 B2
(45) Date of Patent: May 5, 2026

(54) ARRAY OF HEAT-SINKED POWER SEMICONDUCTORS

(71) Applicant: AMERICAN AXLE & MANUFACTURING, INC., Detroit, MI (US)

(72) Inventor: Jeffrey J. Ronning, Grosse Pointe Farms, MI (US)

(73) Assignee: AMERICAN AXLE & MANUFACTURING, INC., Detroit, MI (US)

( * ) Notice: Subject to any disclaimer, the term of this patent is extended or adjusted under 35 U.S.C. 154(b) by 0 days.

(21) Appl. No.: 18/745,743

(22) Filed: Jun. 17, 2024

(65) Prior Publication Data

US 2024/0339374 A1 Oct. 10, 2024

Related U.S. Application Data

(63) Continuation of application No. 18/388,873, filed on Nov. 13, 2023, now Pat. No. 12,046,529, which is a
(Continued)

(51) Int. Cl.
| | |
|---|---|
| *H01L 23/36* | (2006.01) |
| *H01L 23/367* | (2006.01) |
| *H01L 25/065* | (2023.01) |

(52) U.S. Cl.
CPC .......... *H01L 23/3672* (2013.01); *H01L 23/36* (2013.01); *H01L 25/0652* (2013.01);
(Continued)

(58) Field of Classification Search
CPC . H01L 23/3672; H01L 23/36; H01L 25/0652; H01L 23/3677; H01L 23/473
See application file for complete search history.

(56) References Cited

U.S. PATENT DOCUMENTS

| | | | |
|---|---|---|---|
| 7,049,688 | B2 | 5/2006 | Teshima et al. |
| 7,598,603 | B2 | 10/2009 | Otremba |

(Continued)

FOREIGN PATENT DOCUMENTS

| | | |
|---|---|---|
| CN | 105280584 A | 1/2016 |
| CN | 105743323 A | 7/2016 |

(Continued)

OTHER PUBLICATIONS

International Search Report and Written Opinion for International Application No. PCT/US2023/025800 dated Oct. 10, 2023 (6 pages).
(Continued)

*Primary Examiner* — Suberr L Chi
(74) *Attorney, Agent, or Firm* — DICKINSON WRIGHT PLLC

(57) ABSTRACT

An array of heat-sinked power semiconductors that includes a power semiconductor and a heat sink. The power semiconductor has a power semiconductor die, a plurality of first terminals and a second terminal. The power semiconductor die has a plurality of semiconductor terminals. Each of the first terminals is electrically coupled to an associated one of the semiconductor terminals. The second terminal is a surface mount terminal and is electrically coupled to one of the first terminals. The heat sink has a heat sink body and a plurality of fins. The heat sink body has a base and an exterior surface. The base is fixedly coupled directly to the surface mount terminal. The exterior surface has a fin mount portion to which the fins extend. At least a portion of the fin-mount portion is oriented non-parallel to base.

7 Claims, 7 Drawing Sheets

Related U.S. Application Data continuation of application No. PCT/US2023/025800, filed on Jun. 21, 2023.

(60) Provisional application No. 63/354,262, filed on Jun. 22, 2022.

(52) U.S. Cl.
CPC .............. *H01L 2225/06562* (2013.01); *H01L 2225/06568* (2013.01)

(56) References Cited

U.S. PATENT DOCUMENTS

| | | | |
|---|---|---|---|
| 8,637,979 B2 | 1/2014 | Miyamoto | |
| 9,593,754 B2 | 3/2017 | Sten | |
| 9,958,049 B1 | 5/2018 | Sten et al. | |
| 10,006,533 B1 | 6/2018 | Strandberg | |
| 10,525,810 B2 | 1/2020 | Jegebris et al. | |
| 11,293,534 B2 | 4/2022 | Downs et al. | |
| 11,303,183 B2 | 4/2022 | Downs et al. | |
| 11,769,701 B2 | 9/2023 | Kasztelan et al. | |
| 12,046,529 B2 * | 7/2024 | Ronning | H01L 23/44 |
| 2003/0155110 A1 | 8/2003 | Joshi et al. | |
| 2008/0164590 A1 | 7/2008 | Xiaochun et al. | |
| 2010/0038758 A1 * | 2/2010 | Stolze | H01L 25/07 |
| | | | 438/106 |
| 2011/0318884 A1 | 12/2011 | Noritake et al. | |
| 2014/0091452 A1 | 4/2014 | Katou et al. | |
| 2016/0157384 A1 | 6/2016 | Liu et al. | |
| 2020/0144150 A1 | 5/2020 | Otremba et al. | |
| 2021/0378144 A1 | 12/2021 | Oshima | |
| 2022/0037241 A1 | 2/2022 | Downs et al. | |
| 2023/0134328 A1 | 5/2023 | Morgante et al. | |

FOREIGN PATENT DOCUMENTS

| | | | |
|---|---|---|---|
| CN | 109473410 A | 3/2019 | |
| DE | 102011077543 A1 | 12/2011 | |
| JP | 2019021785 A | 2/2019 | |
| JP | 2019117944 A | 7/2019 | |
| WO | WO2022260769 A1 | 12/2022 | |

OTHER PUBLICATIONS

International Preliminary Report on Patentability for International Application No. PCT/US2023/025800 dated Oct. 10, 2023 (4 pages).
First Office Action of CN 202380048805.0, mailed Apr. 26, 2025.
First Office Action of CN 202380048805.0, mailed Apr. 26, 2025, substantial part of English translation.

* cited by examiner

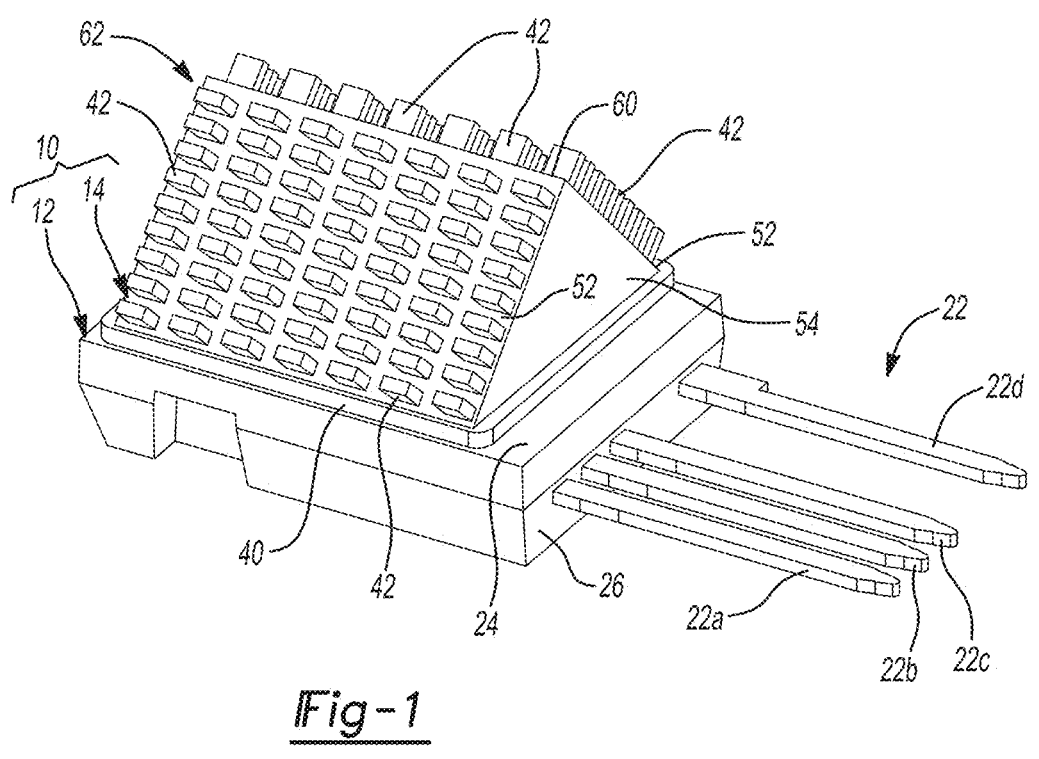
_Fig-1_
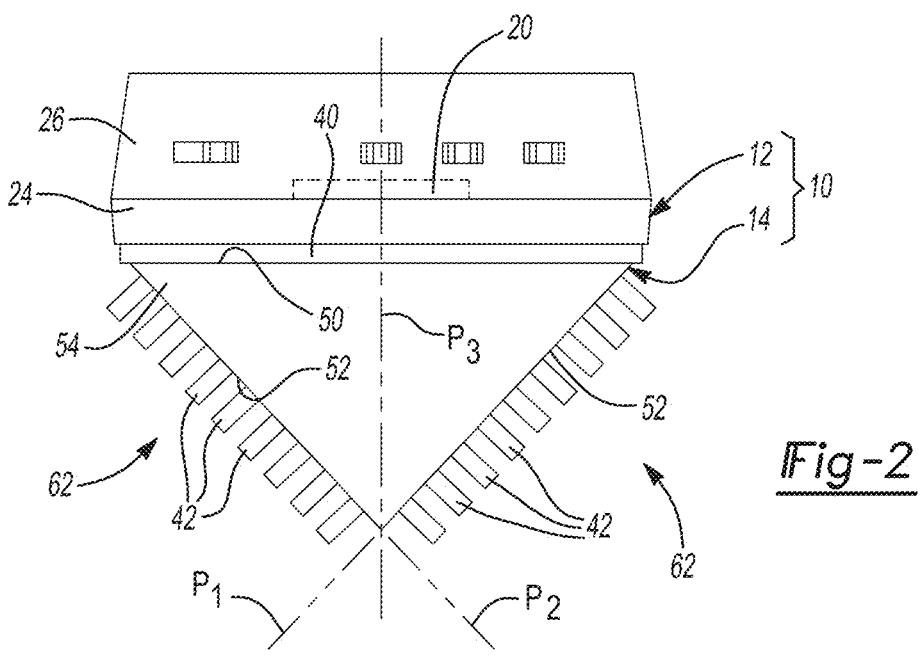
_Fig-2_

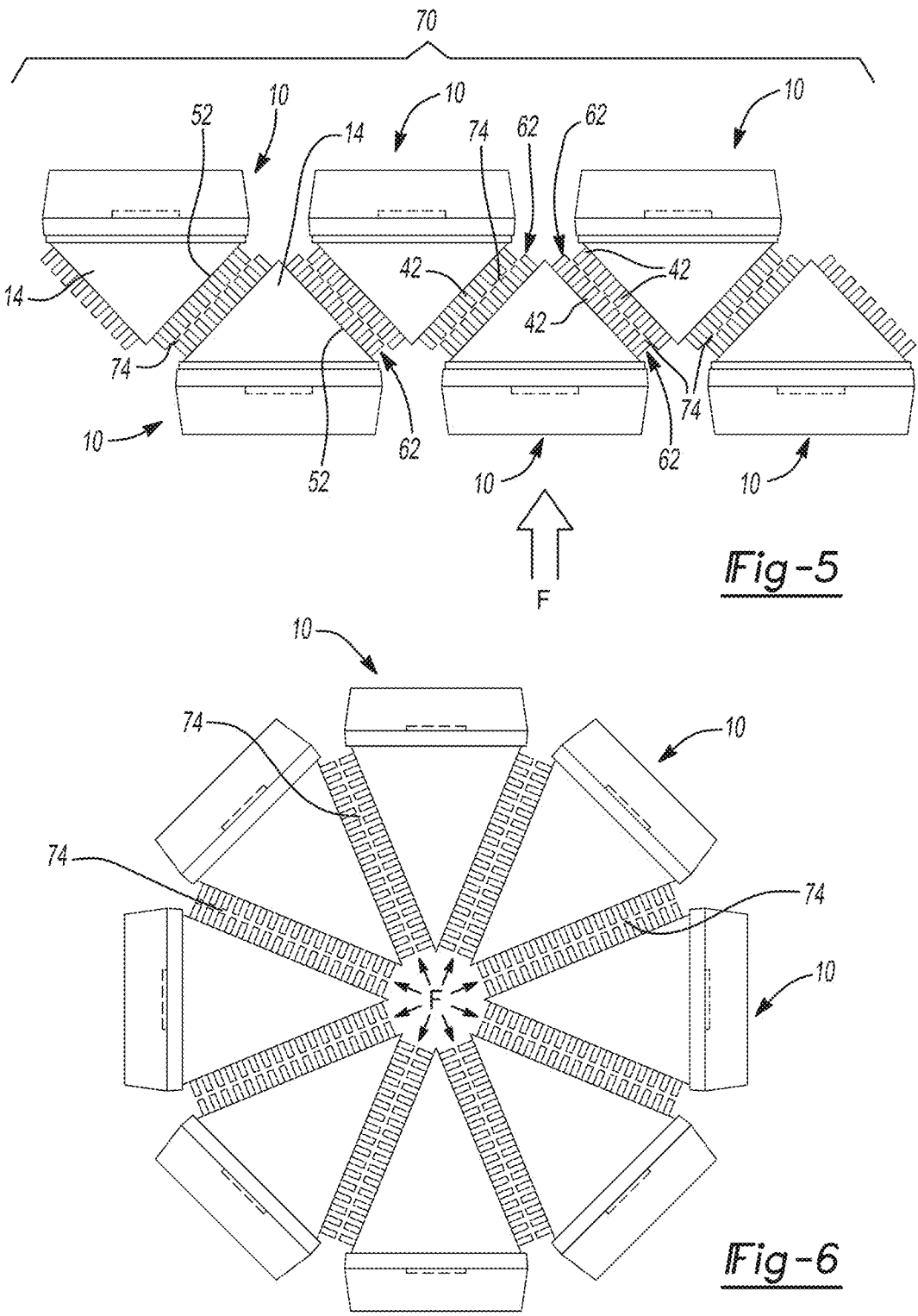
_Fig-5_
_Fig-6_

ARRAY OF HEAT-SINKED POWER SEMICONDUCTORS

CROSS-REFERENCE TO RELATED APPLICATIONS

This application claims the benefit of U.S. Provisional Application No. 63/354,262, filed on Jun. 22, 2022, the disclosure of which is incorporated by reference as if fully set forth herein.

FIELD

The present disclosure relates to a heat-sinked power semiconductor, as well as to a related inverter, motor assembly and vehicle drive unit.

BACKGROUND

This section provides background information related to the present disclosure which is not necessarily prior art.

Commonly assigned U.S. Pat. No. 11,303,183 discloses a motor assembly having an inverter with a plurality of heat-sinked power semiconductors that comprise a power semiconductor and a heat sink that is fixedly coupled to the power semiconductor. The power semiconductor can be any type of power semiconductor that can controlled to selectively transmit electrical power, such as a MOSFET or IGBT, that has a power semiconductor die, a plurality of pin terminals that are electrically coupled to the power semiconductor die, and a plate terminal that is electrically coupled to one of the pin terminals. The heat sink can be formed of a suitable material, such as copper, and is coupled to the plate terminal in a suitable manner, such as a solder connection that mechanically bonds and electrically couples the heat sink to the plate terminal. A suitable fluid is circulated through the inverter and passes through fins on the heat sink to cool the heat-sinked power semiconductors during the operation of the motor assembly.

Commonly assigned International Patent Application No. PCT/US2022/026127 discloses a motor assembly having an inverter with a plurality of heat-sinked power semiconductors and a heat sink that is fixedly coupled to the power semiconductor. The power semiconductor can be any type of power semiconductor that can controlled to selectively transmit electrical power, such as a MOSFET or IGBT, that has a power semiconductor die, a plurality of pin terminals that are electrically coupled to the power semiconductor die, and a plate terminal that is electrically coupled to one of the pin terminals. The heat sink can be formed of a suitable material, such as copper, and is coupled to the plate terminal in a sintering operation. A suitable fluid is circulated through the inverter and passes through fins on the heat sink to cool the heat-sinked power semiconductors during the operation of the motor assembly. The sinter bond between the heat-sink and the plate terminal is relatively more robust than the solder bond that is disclosed in U.S. Pat. No. 11,303,183.

Commonly assigned U.S. Patent Application Publication No. 2022/0037241 discloses a motor assembly having an inverter with a plurality of heat-sinked power semiconductors in which the heat sink and plate terminal are unitarily and integrally formed. Configuration in this manner eliminates the bond between the heat sink and the plate terminal.

While the above configurations are satisfactory for their intended purpose, there nevertheless remains a need in the art for a heat-sinked power semiconductor that is capable of rejecting heat from the power semiconductor at a relatively higher rate.

SUMMARY

This section provides a general summary of the disclosure, and is not a comprehensive disclosure of its full scope or all of its features.

In one form, the present disclosure provides an array of heat-sinked power semiconductors that includes a power semiconductor and a heat sink. The power semiconductor has a power semiconductor die, a plurality of first terminals and a second terminal. The power semiconductor die has a plurality of semiconductor terminals. Each of the first terminals is electrically coupled to an associated one of the semiconductor terminals. The second terminal is a surface mount terminal and is electrically coupled to one of the first terminals. The heat sink has a heat sink body and a plurality of sets of fins. The heat sink body has a base and a plurality of boundary surfaces. The base is fixedly coupled directly to the surface mount terminal. Each of the boundary surfaces terminates at an associated boundary surface plane. Each of the boundary surface planes intersects at least one of the other boundary surface planes. Each of the sets of fins is fixedly coupled to the body and extends directly from an associated one of the boundary surfaces.

In another form, the present disclosure provides an array of heat-sinked power semiconductors that includes a power semiconductor and a heat sink. The power semiconductor has a power semiconductor die, a plurality of first terminals and a second terminal. The power semiconductor die has a plurality of semiconductor terminals. Each of the first terminals is electrically coupled to an associated one of the semiconductor terminals. The second terminal is a surface mount terminal and is electrically coupled to one of the first terminals. The heat sink has a heat sink body and a plurality of fins. The heat sink body has a base and an exterior surface. The base is fixedly coupled directly to the surface mount terminal. The exterior surface has a fin mount portion to which the fins extend. At least a portion of the fin-mount portion is oriented non-parallel to base.

In still another form, the present disclosure provides an array of heat-sinked power semiconductors that includes a plurality of heat-sinked power semiconductors. Each of the heat-sinked power semiconductors has a power semiconductor and a heat sink. The power semiconductor has a power semiconductor die, a plurality of first terminals and a second terminal. The power semiconductor die has a plurality of semiconductor terminals. Each of the first terminals is electrically coupled to an associated one of the semiconductor terminals. The second terminal is a surface mount terminal and is electrically coupled to one of the first terminals. The heat sink has a heat sink body and a plurality of fins. The heat sink body has a base and an exterior surface. The base is fixedly coupled directly to the surface mount terminal. The exterior surface has a fin mount portion to which the fins extend. At least a portion of the fin-mount portion are oriented non-parallel to base. The heat-sinked power semiconductors are arranged such that a portion of the fins on one of the heat-sinked power semiconductors and a portion of the fins on an adjacent one of the heat-sinked power semiconductors are disposed in an associated flow channel that is adapted to receive a flow of coolant.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 is a perspective view of a heat-sinked power semiconductor constructed in accordance with the teachings of the present disclosure;

FIG. 2 is a bottom elevation view of the heat-sinked power semiconductor of FIG. 1;

FIG. 5 is a top plan view of a portion of an inverter for a motor assembly, the inverter incorporating a linear array of the heat-sinked power semiconductors of FIG. 1;

FIGS. 6 and 7 are top plan views of portions of inverters for motor assemblies, each of the inverters incorporating at least one radial array of the heat-sinked power semiconductors of FIG. 1.

Corresponding reference numerals indicate corresponding parts throughout the several views of the drawings.

DETAILED DESCRIPTION

Figure 3:
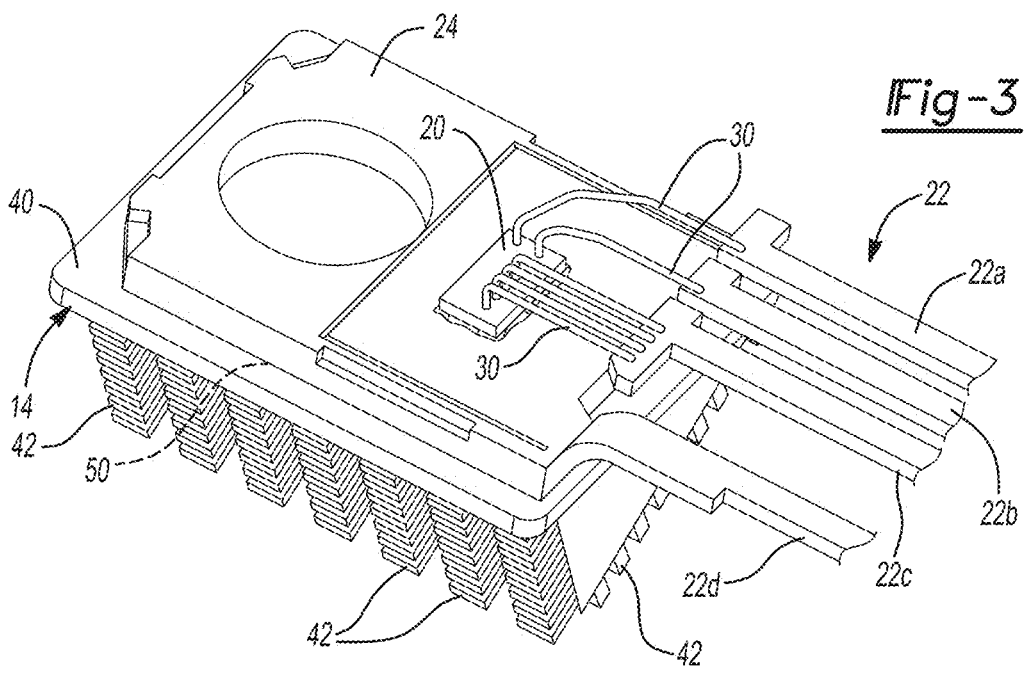
FIG. 3 is a perspective view of a portion of the heat-sinked power semiconductor.
Figure 4:
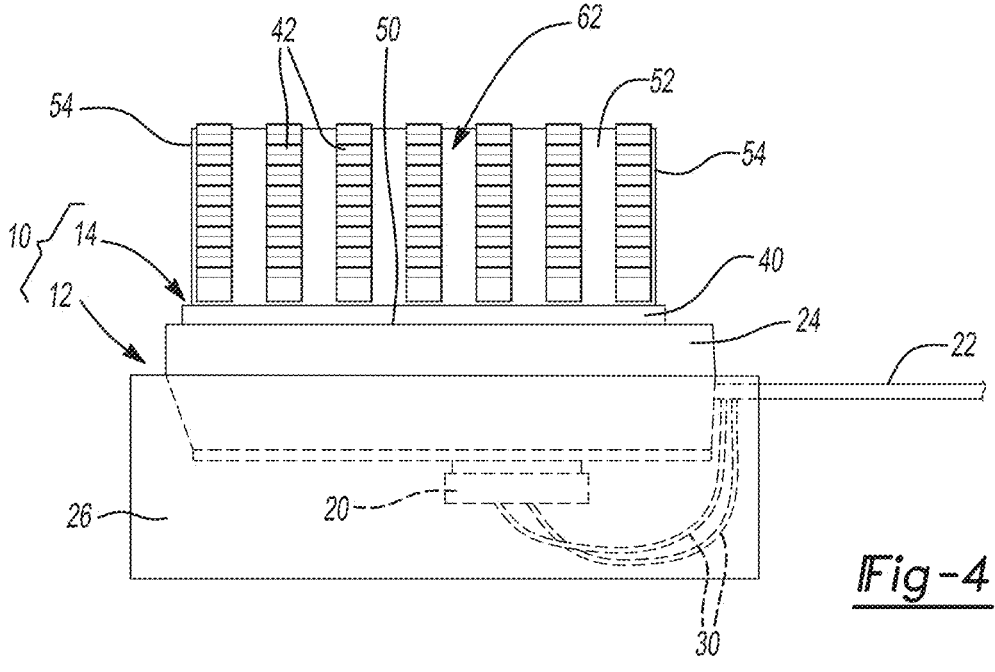
FIG. 4 is a side elevation view of the heat-sinked power semiconductor of FIG. 1.

With reference to FIGS. 1 through 4 of the drawings, a heat-sinked power semiconductor constructed in accordance with the teachings of the present disclosure is generally indicated by reference numeral 10. The heat-sinked power semiconductor 10 can include a power semiconductor 12 and heat sink 14.

The power semiconductor 12 can be any type of power semiconductor, such as a transistor. For example, the power semiconductor 12 could be an Insulated Gate Bipolar Transistor (IGBT), but in the particular example provided is a Metal Oxide Semiconductor Field Effect Transistor (MOSFET). The power semiconductor 12 can include a semiconductor die 20, a plurality of pin terminals 22, a plate terminal 24, and an encapsulant body 26. The semiconductor die 20 can have a plurality of semiconductor terminals (not specifically shown) that are each electrically coupled to an associated one of the pin terminals 22. In the example provided, the semiconductor die 20 has four semiconductor terminals that comprise a gate (not specifically shown), a source sense (not specifically shown), a source (not specifically shown), and a drain (not specifically shown). Each of the pin terminals 22 is formed of an electrically conductive metal material, such as copper, and can be electrically coupled to an associated one of the semiconductor terminals. For example, each of the pin terminals 22 can be bonded to an associated one of the semiconductor terminals with a solder material to thereby electrically and physically couple the pin terminal 22 to the associated one of the semiconductor terminals. Alternatively, one or more bond wires 30 could be employed to electrically couple one of the pin terminals 22 to an associated one of the semiconductor terminals. The plate terminal 24 can be electrically coupled to one of the pin terminals 22 and could be directly mounted to one of the semiconductor terminals. In the example provided, the pin terminal 22*a* is electrically coupled to the gate, the pin terminal 22*b* is electrically coupled to the source sense, the pin terminal 22*c* is electrically coupled to the source, and the pin terminal 22*d* is electrically coupled to both the drain and the plate terminal 24. The plate terminal 24 is formed of a suitable electrically conductive metal material, such as copper. The encapsulant body 26 is formed of an encapsulant material that is disposed over the semiconductor die 20. The semiconductor die 20 and the bond wires 30 are fully encapsulated in the encapsulant material, and the pin terminals 22 are partly encapsulated in the encapsulant material. Optionally, the plate terminal 24 can be partly encapsulated in the encapsulant material.

The heat sink 14 can have a body or heat sink base 40 and a plurality of fins 42 that are fixedly coupled to and project outwardly from the heat sink base 40. The heat sink base 40 can be formed of an appropriate material, such as copper and can be formed in a shape that permits at least two distinct sets of the fins 42 to project from the heat sink base 40 in different directions. In the example provided, the heat sink base 40 is generally wedge-shaped having a bottom or base surface 50, a pair of first faces 52 and a pair of second faces 54. The first faces 52 are opposite one another and intersect one another along a linear apex 60. The first faces 52 are boundary surfaces of the heat sink base 40 and terminate at respective boundary surface planes P1, P2. The boundary surface plane P1 of one of the first faces 52 can intersect the boundary surface plane P2 of a second, adjacent one of the first faces 52. Optionally, adjacent ones of the first faces 52 can intersect one another.

A respective set 62 of the fins 42 extends perpendicularly from each of the first faces 52. The fins 42 of each set 62 of the of fins 42 can be fixedly coupled to the heat sink base 40 and can extend directly from an associated one of the first faces 52. At least one set 62 of the fins 42 can be unitarily and integrally formed with the heat sink base 40. The sets 62 of fins 42 on an adjacent pair of first faces 52 can be disposed symmetrically about a plane P3 of symmetry that intersects the boundary surface planes P1, P2 of the adjacent pair of the first faces 52. The second faces 54 are opposite one another and are flat and parallel to one another in this particular example. It will be appreciated that the heat sink base 40 could be shaped differently and/or that the fins 42 could be formed on or project from additional or other faces or sides of the heat sink base 40 from what is shown in the accompanying drawings. For example, the heat sink base 40 could be shaped as a pyramid or a truncated pyramid, and a set of the fins 42 could be formed on two or more of the faces of pyramid or truncated pyramid.

The fins 42 of each set 62 of fins 42 can be shaped and spaced in any desired manner. In the particular example provided, each of the fins 42 has a tapered rod-like configuration, with an oval cross-sectional shape that is relatively larger where proximal ends of the fins 42 abut the heat sink base 40, and relatively narrower opposite or distal end. Moreover, the distal ends of the fins 42 are slanted so as to lie in a plane that is not perpendicular to the longitudinal axes of the fins 42. As such, the fins 42 are not uniform in their height in the example provided. If desired, the heat sink 14 can be integrally and unitarily formed in a desired manner, such as investment casting, cold forging or metal injection molding (MIM). Alternatively, the heat sink base 40 and the fins 42 could be formed as discrete components and can be assembled together such that the fins 42 are fixedly coupled to the heat sink base 40.

The heat sink base 40 and the plate terminal 24 could be unitarily and integrally formed with one another. Alternatively, the heat sink base 40 and the plate terminal 24 could be fixedly and electrically coupled to one another, for example through soldering or sintering.

Figure 7:
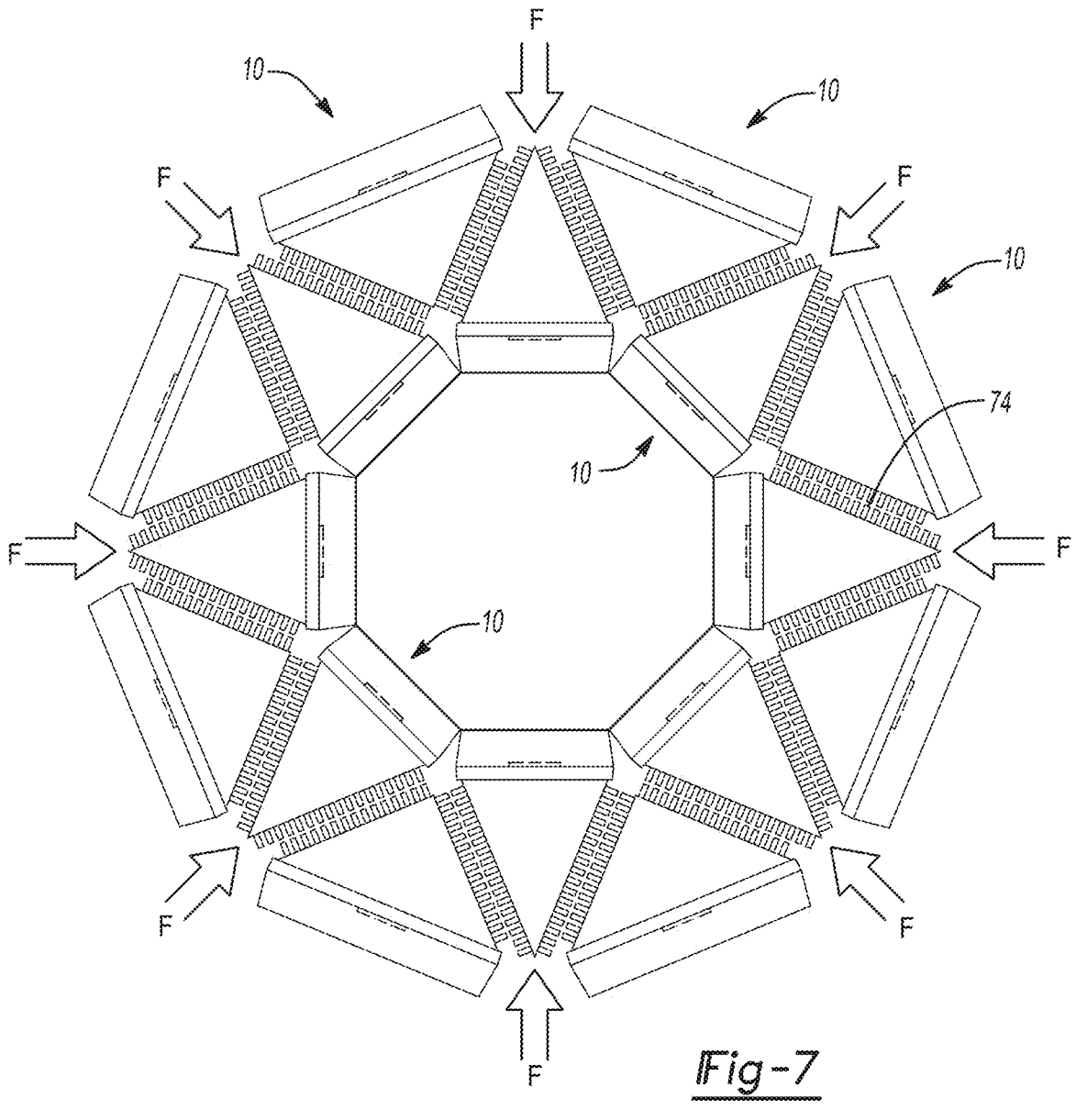

FIGS. 5 through 7 depict the above-described heat-sinked power semiconductors 10 as integrated into an inverter of a motor assembly that is employed in an electric drive unit for a vehicle. The inventor, motor assembly and electric drive unit can be configured as described in U.S. Pat. No. 11,303, 183 or International Patent Application No. PCT/US2022/019900 filed Mar. 11, 2022, the disclosures of which are incorporated by reference as if fully set forth in detail herein.

With reference to FIG. 5, the heat-sinked power semiconductors 10 could be arranged in one or more linear arrays 70 where adjacent ones of the heat-sinked power semiconductors 10 are nested together such that the sets 62 of fins 42 on adjacent sides of the heat-sinked power semiconductors 10 cooperate to form flow channels 74. The linear array 70 can be exposed to a flow of coolant F that is generally perpendicular to the linear array 70. Coolant that contacts the linear array 70 can be forced through the flow channels 74 (i.e., between sets 62 of fins 42 on the first faces 52 of adjacent heat sinks 14). In the example shown, adjacent heat-sinked power semiconductors 10 are depicted as being offset from one another so that the flow channels 74 include a space between the adjacent heat-sinked power semiconductors 10. It will be appreciated, however, that the sets 62 of fins 42 of adjacent heat-sinked power semiconductors 62 could be nested together. Accordingly, it will be appreciated that each flow channel 74 consists of the volume of space between the first faces 52 of adjacent heat sinks 14 less the volume of the fins 42 that extend from the first faces 52 of adjacent heat sinks 14.

Alternatively, the heat-sinked power semiconductors 10 could be arranged in one or more radial arrays as shown in FIGS. 6 and 7. In the example of FIG. 6, coolant flows from the interior of the radial array 80 through the flow channels 74 in a radially outward direction. In the example of FIG. 7, two concentric radial arrays 80*a* and 80*b* are employed, and the flow channels 74 that are formed between the heat-sinked power semiconductors 10 of the two radial arrays 80*a* and 80*b* permit coolant flow in a radial direction (radially inwardly-directed in the example shown) through the radial arrays 80*a* and 80*b*.

It will be appreciated that an array of the heat-sinked power semiconductors 10 could be formed to have a geometry other than those that are described herein and shown in the accompanying figures. Moreover, the flow of coolant could be directed through an array of the heat-sinked power semiconductors 10 in directions that are different from those that are described herein and shown in the accompanying figures. For example, the flow of coolant could be directed orthogonal to the array. In the examples of FIGS. 5 through 7, the flow of coolant could be directed into or out of the drawing page rather than in the particular direction that is illustrated.

Figure 8:
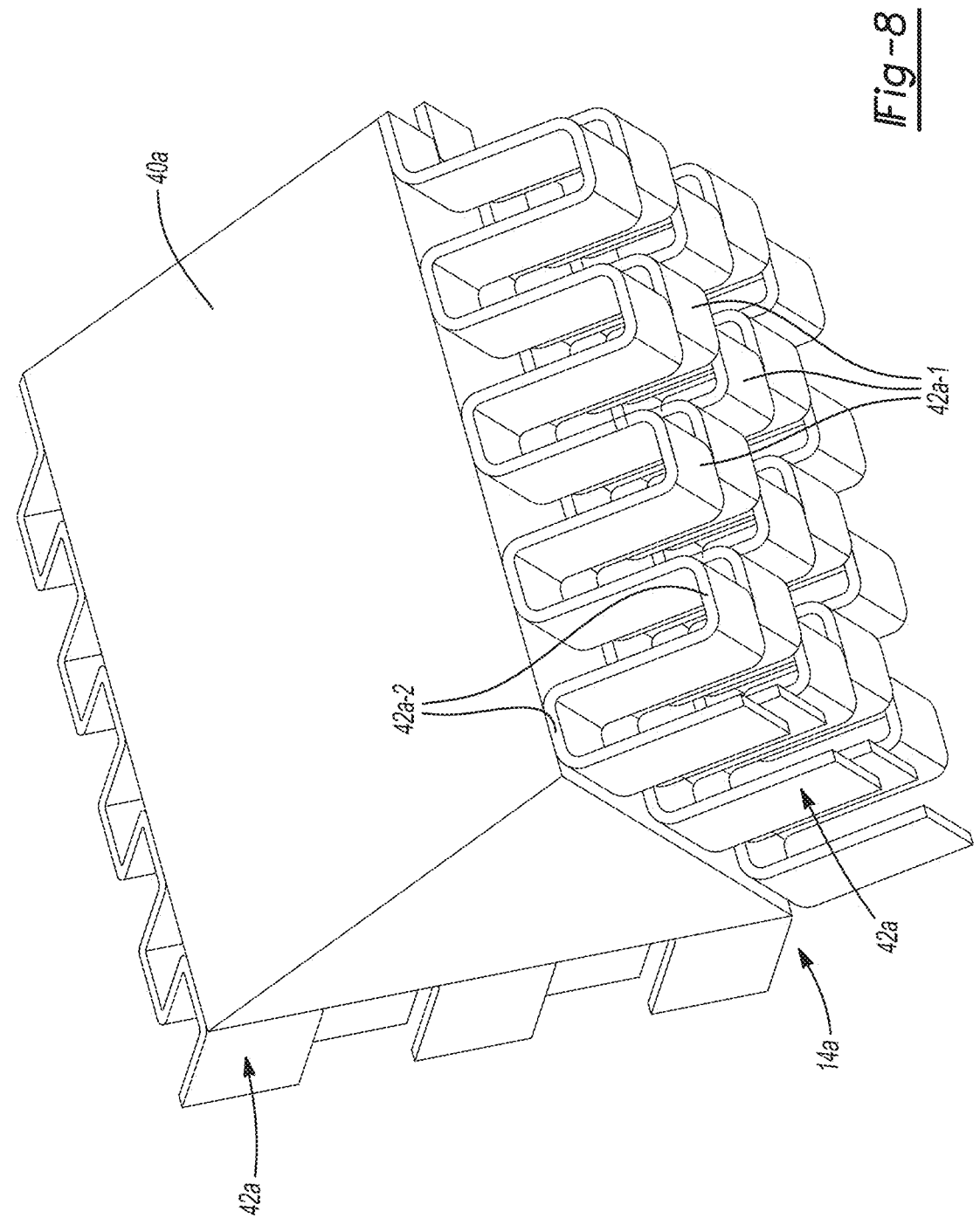
FIGS. 8 through 10 are perspective views of alternately configured heat sinks.

With reference to FIG. 8, a first alternately constructed heat sink 14*a* is shown. In this example, the heat sink base 40*a* and each of the two distinct sets of fins 42*a* are formed as discrete components that are fixedly coupled to one another, for example through sintering, brazing, soldering and/or welding. Each of the sets of fins 42*a* can include a plurality of fin sub-sets 42*a*-1 that are formed of a strip of material, such as copper, and is bent to form a plurality of alternating projections 42*a*-2 of a desired shape. In the example provided, the alternating projections 42*a*-2 of each fin sub-set 42*a*-1 are formed with a square-wave shape, and the alternating projections 42*a*-2 of each adjacent pair of fin sub-sets 42*a*-1 are offset from one another.

Figure 9:
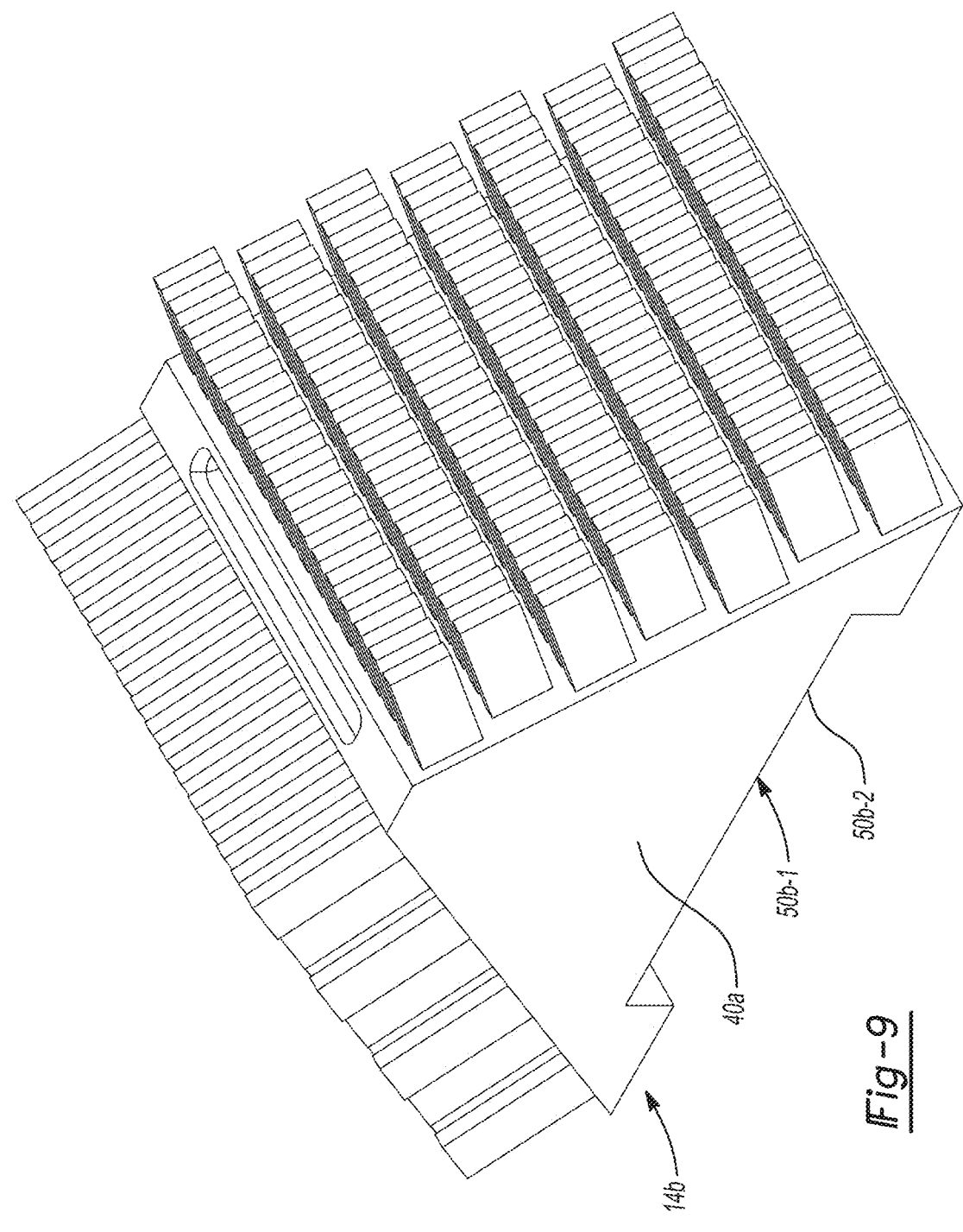

In the example of FIG. 9, a channel 50*b*-1 is formed in the heat sink base 40*b* of the heat sink 14*b*. The channel 50*b*-1 defines the base surface 50*b* and is sized to receive the power semiconductor 12 (FIG. 1) therein. Accordingly, it will be appreciated that the heat sink base 40*b* overhangs the lateral sides of the power semiconductor 12 (FIG. 1) when the heat sink 14*b* is mounted to the power semiconductor 12 (FIG. 1).

Figure 10:
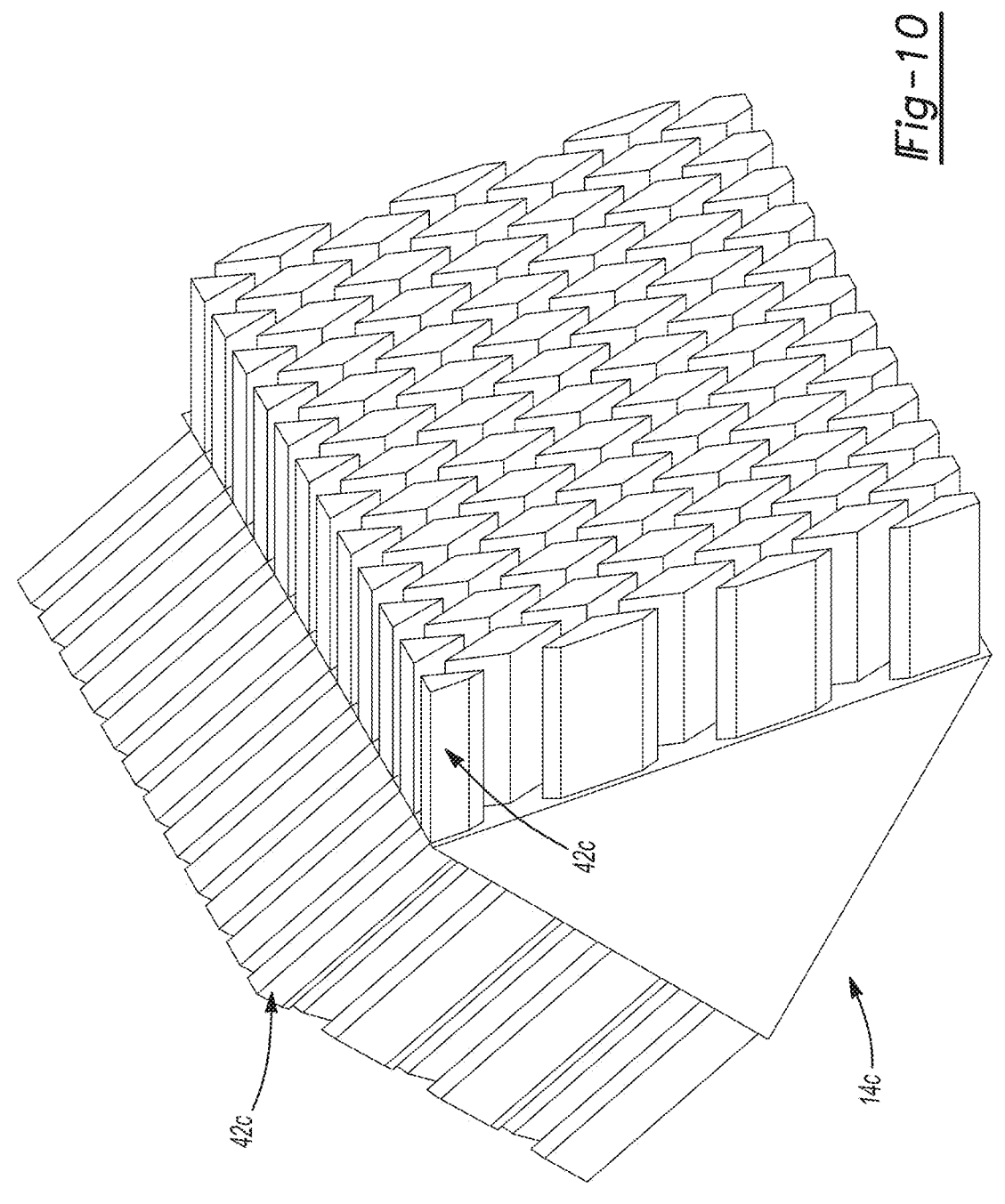

The example of FIG. 10 illustrates the fin sets 42*c* of the heat sink 14*c* as being formed of columnar fins having diamond and triangular cross-sectional shapes. It will be appreciated that the fins of the fin sets could be configured in various different manners, including columnar fins with a circular or square shape.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An array of heat-sinked power semiconductors comprising:

a power semiconductor having a power semiconductor die, a plurality of first terminals and a second terminal, the power semiconductor die having a plurality of semiconductor terminals, each of the first terminals being electrically coupled to an associated one of the semiconductor terminals, the second terminal being a surface mount terminal and electrically coupled to one of the first terminals; and a heat sink having a heat sink body and a plurality of sets of fins, the heat sink body having a base surface entirely formed with a plane parallel to and fixedly coupled directly to the surface mount terminal, a pair of first faces opposite one another along a linear apex such that the sets of fins project away from the heat sink body in different directions, and a pair of second faces opposite and parallel to one another, wherein the heat sink body is formed with a closed wedge-shape by all of the faces such as the base surface, the pair of first faces and the pair of second faces.

2. The array of heat-sinked power semiconductors of claim 1, wherein the first faces are boundary surfaces of the heat sink base and terminate at respective boundary surface planes.

3. The array of heat-sinked power semiconductors of claim 1, wherein the heat sink body has two boundary surfaces.

4. The array of heat-sinked power semiconductors of claim 1, wherein at least one of the sets of fins is unitarily and integrally formed with the heat sink body.

5. An array of heat-sinked power semiconductors comprising:

a power semiconductor having a power semiconductor die, a plurality of first terminals and a second terminal, the power semiconductor die having a plurality of semiconductor terminals, each of the first terminals being electrically coupled to an associated one of the semiconductor terminals, the second terminal being a surface mount terminal and electrically coupled to one of the first terminals; and a heat sink having a heat sink body and a plurality of fins, the heat sink body having a base and a plurality of exterior surfaces, which form a closed wedge-shape, the base being fixedly coupled directly to the surface mount terminal and at least one of the plurality of exterior surfaces having a fin mount portion to which the fins extend, at least a portion of the fin-mount portion being non-parallel to base, wherein the fin-mount portion includes first and second planar segments intersecting one another.

6. The array of heat-sinked power semiconductors of claim 5, wherein the first and second planar segments that are not parallel to one another.

7. The array of heat-sinked power semiconductors of claim 5, wherein at least a portion of the fins is unitarily and integrally formed with the heat sink body.

* * * * *